United States Patent [19]

Hoshino et al.

[11] 3,968,423
[45] July 6, 1976

[54] NUCLEAR MAGNETIC RESONANCE APPARATUS OF FOURIER TRANSFORM TYPE

[75] Inventors: Yasutaka Hoshino; Yoshiharu Utsumi; Nobuhiko Aoki; Hiroshi Yokokawa, all of Katsuta, Japan

[73] Assignee: Hitachi, Ltd., Japan

[22] Filed: Oct. 10, 1974

[21] Appl. No.: 513,774

[30] Foreign Application Priority Data
Oct. 12, 1973 Japan.............................. 48-113937

[52] U.S. Cl............................. 324/.5 AC; 324/.5 R
[51] Int. Cl.²........................................ G01R 33/08
[58] Field of Search .............. 324/.5 A, .5 AC, .5 R

[56] References Cited
UNITED STATES PATENTS

| | | | |
|---|---|---|---|
| 3,287,629 | 11/1966 | Varian | 324/.5 AC |
| 3,720,816 | 3/1973 | Keller | 324/.5 AC |
| 3,792,346 | 2/1974 | Gibby | 324/.5 AC |

*Primary Examiner*—R. V. Rolinec
*Assistant Examiner*—Michael J. Tokar
*Attorney, Agent, or Firm*—Craig & Antonelli

[57] ABSTRACT

The nuclear resonance signal obtained from the sample is stored in a memory circuit and the stored signal is then repeatedly read out. A periodic function which is derived as a result of the transformation of a triangular wave into a trapezoidal one, is used for the Fourier transformation of the repeatedly read-out signal. The adverse influence of the transient phenomenon in the h-f impulse signal on the resultant spectrum is eliminated by stopping the Fourier transformation only during the initial portion of the read-out period of the memory circuit.

8 Claims, 6 Drawing Figures

NUCLEAR MAGNETIC RESONANCE APPARATUS OF FOURIER TRANSFORM TYPE

BACKGROUND OF THE INVENTION

1. Field of the Invention

The present invention relates to a nuclear magnetic resonance apparatus of Fourier transform type, which has a simple structure and can enjoy a high efficiency.

2. Description of the Prior Art

In order to obtain a spectrum of energy absorption due to the nuclear magnetic resonance phenomenon caused in a sample placed in an intense magnetic field, there are usually used two artifices: the frequency sweep method in which the h-f field applied to the sample is swept through nuclear resonant values and the magnetic field sweep method in which the intense field the sample is placed in is swept through nuclear resonant values. According to these methods, however, the resonance signal obtained by a single sweep is too weak to be observed so that the speed of sweep must be slow and the sweep must be repeated several times in order to obtain a signal observable enough. This takes a very long time for measurement, e.g. several tens of hours in a certain measurement case.

On the other hand, there is a method proposed to shorten the time taken in the measurement. According to the method, an h-f impulse field is repeatedly applied to a sample and the resonance signal induced as a result is subjected to Fourier transform to produce a resonance absorption spectrum. This method has on the one hand a great advantage since it needs rather a short time for measurement, but on the other hand, it has a drawback in a sense of economy since a conventional device used in it to perform the Fourier transform is usually an electronic computer which is very expensive. Namely, half the price of nuclear magnetic resonance apparatus using an electronic computer as the Fourier transform device was usually ascribed to the computer itself. Accordingly, there has been a great demand for a nuclear magnetic resonance apparatus which is not furnished with an electronic computer and therefore inexpensive and which can attain an efficiency higher than with a nuclear magnetic resonance apparatus using an electronic computer. In order to meet this requirement, the inventors have designed and employed anew a circuit to perform the Fourier transform in an analog fashion, which is constituted only of inexpensive analog IC elements sold on the market, instead of using an electronic computer serving as a conventional Fourier transform device operating digitally.

SUMMARY OF THE INVENTION

One object of the present invention is to provide a nuclear magnetic resonance apparatus of Fourier transform type, which is of small size and inexpensive.

Another object of the present invention is to provide a nuclear magnetic resonance apparatus of Fourier transform type, whose Fourier transform device can be easily fabricated by combining together transistors and IC chips generally sold on the market.

According to one preferred embodiment of the present invention, an h-f impulse field is repeatedly applied to a sample, the nuclear resonance signal induced from the sample is stored in a memory circuit, and the stored signal is iteratively read out. The iteratively read signal is then Fourier-transformed by a periodical function, which is prevented from generating in synchronism with the period of the repetitive reading of the resonance signal. Other object and features of the present invention will be apparent from the following description of the embodiment, taken in conjunction with the attached drawings.

DESCRIPTION OF THE PREFERRED EMBODIMENT

Figure 1:
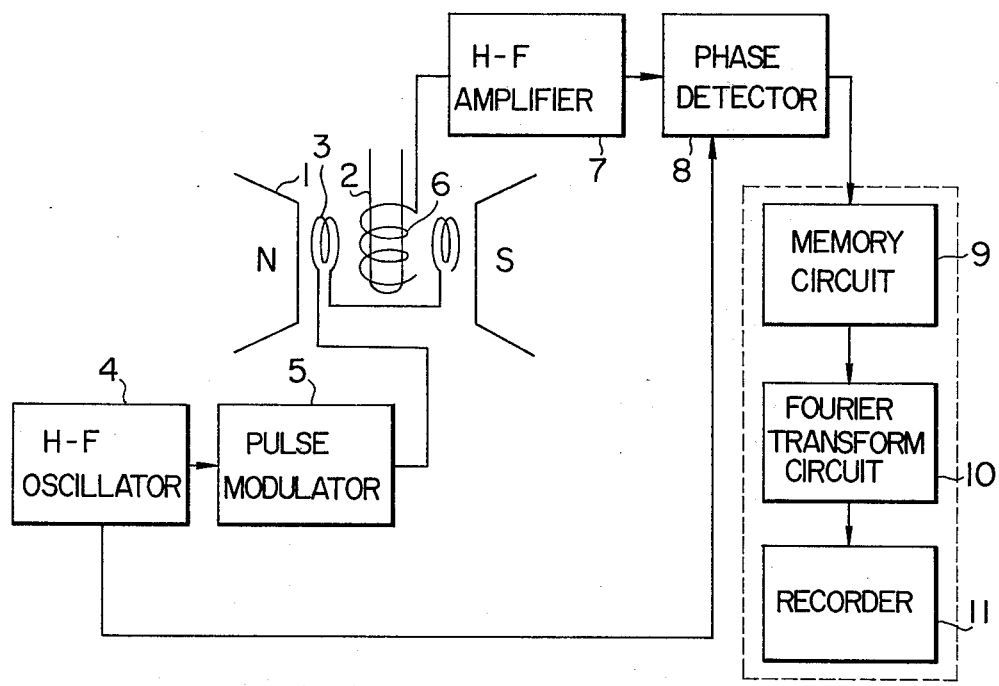
FIG. 1 schematically shows a fundamental structure of a nuclear magnetic resonance apparatus of Fourier transform type.

FIG. 1 schematically shows a structure of a nuclear magnetic resonance apparatus of Fourier transform type, in which an h-f impulse field is repeatedly applied to a sample and the resultant resonance signal obtained from the sample is Fourier-transformed to produce a resonance spectrum. The principle of the apparatus will first of all be described.

A sample 2 surrounded by a detection coil 6 is placed in a uniform, unidirectional magnetic field established between the N and S poles of a magnet 1. The nuclear spin of the sample 2 is oriented by the unidirectional field. An h-f exciting coil 3 serves to generate an h-f magnetic field perpendicular to the unidirectional magnetic field. An h-f oscillator 4 feeds its output to a pulse modulator 5 so that the h-f signal generated by the oscillator 4 is pulse-modulated to supply an h-f impulse signal for the h-f exciting coil 3. Accordingly, the sample is exposed to the h-f impulse field build up by the exciting coil 3 so that the nuclear spin of the sample 2 oriented after the application of the h-f impulse field, is excited. The oscillating wavelet caused due to the excitation of the nuclear spin is detected by the detection coil 6.

Figure 2:
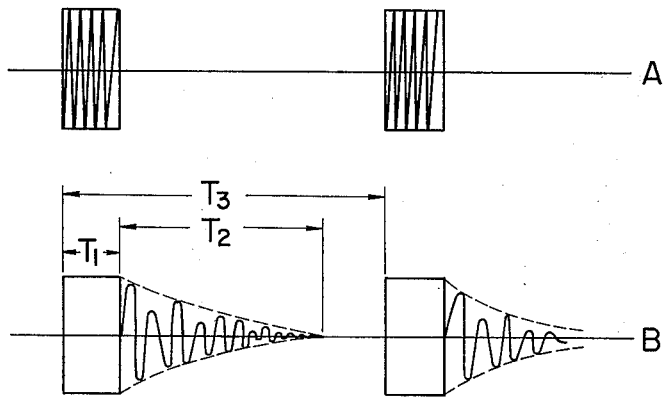
FIG. 2 shows an h-f impulse signal used in the apparatus.

FIG. 2 shows examples of the h-f impulse signal and the oscillating waveform due to the excitation of the nuclear spin. The waveform A is the impulse signal derived from the pulse modulator 5 as a result of pulse modulation of the output h-f signal from the h-f oscillator 4. The waveform B is the damped oscillations induced in the detection coil 6 due to the application of the h-f impulse signal to the h-f exciting coil 3. The waveform B is usually termed "interferogram", which indicates that the nuclear spin is undergoing excitation. In other words, the interferogram is the evidence of resonance (absorption) at the frequencies proper to the nuclei constituting the sample under investigation.

In the embodiment of the present invention, the oscillating frequency of the h-f oscillator 4 is set to 10 – 22 MHz, depending upon the intensity of the unidirectional magnetic field. In FIG. 2, the pulse width $T_1$ is chosen to be about 10 microseconds, and the pulse width $T_3$ can be chosen to have any value between 0.5 sec and 64 sec, the width $T_3$ being determined as a rule by the period of free damped oscillation, i.e. relaxation time, characteristic of the sample.

As described above, the induced resonance signal is very weak and therefore in order to improve the signal-to-noise ratio, an h-f impulse signal is applied to the exciting coil so as to expose the sample to an h-f impulse magnetic field repeatedly and the data obtained from the sample is stored in the memory circuit. For this purpose, the nuclear magnetic resonance apparatus according to the present invention is so designed that the number of the repeated applications of the impulse signal can be manually controlled depending upon the kind of sample to be examined. The manual control device is, however, omitted from the figure.

The resonance signal induced due to the excitation of the nuclei in the sample by the h-f impulse field, is detected by the detection coil 6 and sent to an h-f amplifier 7. The resonance signal now amplified by the h-f amplifier 7 is fed to one of the outputs of a phase detector 8, to the other output of which the output of the h-f oscillator 4 is applied as a reference signal. Accordingly, the so-called phase detection is carried out in this stage, that is, the phase detector 8 delivers an output only when the phase of the output of the amplifier 7 coincides with that of the oscillator 4. As a result, a transient resonance signal having as a component the difference between the frequency of the reference signal and that of the amplified resonance signal, can be derived from the phase detector 8 as an interferogram. The interferogram is then stored in a memory circuit 9 and the stored interferogram is repeatedly read out and sent to a Fourier transform circuit 10. The circuit 10 converts the frequency components contained in the interferogram into a dc output through Fourier transform and the dc output is applied to a recorder 11 to obtain a frequency spectrum on the recording paper of the recorder 11. Thus, the fundamental structure of the nuclear magnetic resonance apparatus of Fourier transform type, to which the present invention is applied, has been described as a whole. The gist of the invention is, however, in the Fourier transform circuit and the circuit elements inclusive of the memory circuit 9, enclosed by dotted line in FIG. 1 are further decomposed into more basic constituents as seen in the block diagram in FIG. 3, so as to detail the Fourier transform circuit.

The memory circuit 9 stores therein the data on the basis of the interferogram obtained from the phase detector 8 in FIG. 1. If a start instruction signal (not shown) is applied to the memory circuit 9, the circuit 9 delivers an output signal to a triangular wave reset pulse generator 16 so that one of the outputs of the generator 16 is reduced to a lower level (hereafter referred to as "rendered off") to start the operation of a triangular wave generator 21 which generates a triangular wave as a periodic function. On the other hand, the other output of the generator 16 renders off the output of a memory read-out pulse generator 17, whose output instructs the memory circuit 9 to start reading so that the output of the memory circuit 9 is sent to a multiplier 12. At the time of completion of the first read-out operation, the memory circuit 9 delivers a pulse indicative of the completion of the read-out operation to the triangular wave reset pulse generator 16 so that the output of the generator 16 flips up to a higher level (hereafter referred to as "rendered on"). The signal rendered off stops the operation of the triangular wave generator 21 and at the same time renders the output of the memory read-out pulse generator 17 on. The output of the generator 17, rendered on is sent to the memory circuit 9 to temporarily stop the second read-out operation, the period of stopping the second read-out continuing until the output of the memory read-out pulse generator 17 has been rendered off again. This period can be arbitrarily set by controlling the internal variables of the generator 17. The output of the triangular wave generator 21, which is delivered in synchronism with the period of reading the content of the memory circuit, is sent through a blanking circuit 22 and a trapezoidal wave processing circuit 23, both described later, to the multiplier 12.

The multiplier 12 makes a product of a trapezoidal wave signal as a periodic function having variable frequencies and the signal of interferogram from the memory circuit 9 and the product as the output of the multiplier 12 is applied to an integrator 13. These operations are equivalent to a case where the product of two periodic functions is made and the thus produced composite function is integrated over a certain range of values of variable to perform Fourier transform. Namely, the associated formula for Fourier cosine transform is $$F(\omega) = \int_0^\infty F(t) \cos\omega t \, dt,$$

where $F(t)$ corresponds to the repeatedly read-out signal of the interferogram and $\cos\omega t$ to the trapezoidal wave signal.

The output of the integrator 13 is fed to a hold circuit 14 which holds the integrated value obtained above. The output of the hold circuit 14 is sent to a recorder 11 to record the above integrated value.

It is necessary for the integrator 13 and the hold circuit 14 to be reset before the second read-out operation is set in, since they must respectively integrate and hold the repeatedly read-out signal at a fixed period. Therefore, the output of the memory read-out pulse generator 17, which serves as the signal to stop the read-out operation of the memory circuit 9, is led to a hold circuit gating pulse generator 18, one of the outputs of which is in turn applied to the hold circuit 14 to reset the signal holding the output so far of the integrator 13. The other output as a reset pulse, of the hold circuit gating pulse generator 18 is supplied for an integrator reset pulse generator 19, the output of which resets the integrator 13 after the hold circuit 14 has been reset.

The recorder 11 serves to record the values repeatedly held by the hold circuit 14. Further, the recorder 11 delivers a signal (e.g. representing the variation in the resistance of the potentiometer, accompanying the movement of the recording paper) in synchronism with the sweep of the recording paper, to a sweep circuit 15, the output of which causes the oscillating frequency of the triangular wave oscillator 21 to vary in timing with the sweep of the recording paper. Since the triangular wave as periodic function has rather a simple waveform, the configuration of the circuit to generate such a waveform can be simple and it is easy to control the time at which the generation of the triangular wave is started. This is one of the advantages of the present invention.

The substitution of a sinusoidal wave generator for the triangular wave generator 21 does not, of course, adversely affect the efficiency of the Fourier transform device. In case where the sinusoidal wave generator is employed, the trapezoidal wave processing circuit 23 which is later described in detail can be omitted.

As described with FIG. 1, transient disorder of waveform takes place at the time when the h-f impulse signal is initiated and terminated, and the disorder is contained in the interferogram as the output of the memory circuit 9 so that the base line at the lower frequency region of the frequency spectrum obtained after Fourier transform fluctuates. The blanking circuit 22 serves just to eliminate such a fluctuation. Especially, the waveform disturbance caused at the instant the impulse signal terminates, is mainly causative of the fluctuation and the blanking circuit 22 functions to temporarily interrupt the output of the triangular wave generator 21 in order that the multiplier 12 may not process the initial portion of the interferogram containing the transient disturbance of the impulse signal.

Figure 4:
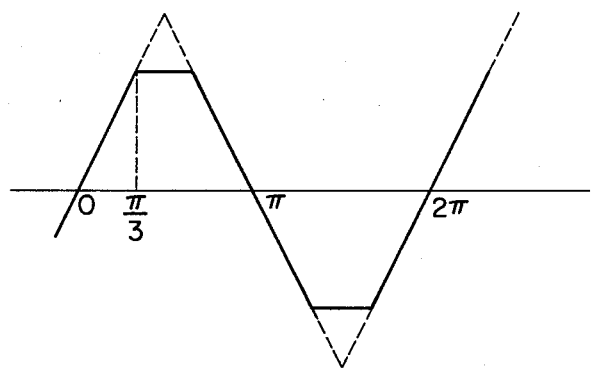
FIG. 4 shows the waveform of a periodic function used for Fourier transform in the nuclear resonance apparatus according to the present invention.

The trapezoidal wave processing circuit 23 receives as its input the output of the triangular wave generator 21, sent through the blanking circuit 22, and transforms the triangular wave into a trapezoidal wave which is a periodic function as the standard of Fourier transform, the trapezoidal wave signal being led to the multiplier 12. The advantage of using the trapezoidal wave processing circuit 23 is as follows. The triangular wave signal contains a higher harmonic having a frequency thrice as high as that of the fundamental frequency and a level equal to one ninth of that of the fundamental wave. If the triangular wave is used for Fourier transform, a pseudo-peak having the above said level due to the higher harmonic appears in the spectrum. In order to eliminate such a spurious peak, the triangular wave from the blanking circuit 22 is clipped, as shown in FIG. 4, to form a trapezoidal wave free from the third harmonic of the triangular wave. This is easily performed by using a peak clipping circuit or limiter. That is understood also from the fact that in the general formula (corresponding to the solid broken line in FIG. 4) of a Fourier series representing a trapezoidal wave, i.e.

$$f(x) = 4h/\pi\alpha \sum_{n=1}^{\infty} \sin(2n-1)\alpha/(2n-1)^2,$$

$\alpha$ must be chosen to equal $\pi/3$ so as to have $\sin(2n-1)\alpha = 0$. Although the triangular wave contains besides the third harmonic higher harmonics of odd order such as the fifth harmonic, the seventh harmonic, etc., the harmonics higher than the fifth never appear in the spectrum since they have frequencies by far higher than that of the fundamental wave so that the frequency range required for Fourier transform is far below the frequencies of the higher harmonics.

A triangular wave generation starting phase controller 20, which is connected with the triangular wave generator 21, controls the time at which the generator 21 starts generating the triangular wave signal, that is, corrects the phase shifting not depending upon frequency but uniformly over the entire range of frequencies involved in Fourier transform. On the other hand, the phase shift caused due to the variation in frequency is the phase difference between the frequency contained in the interferogram and the frequency of the triangular wave used as periodic function. The phase shift changes depending upon the manner of change in frequency, for example, in such a manner that a positive peak (absorption waveform) gradually changes to a negative peak (dispersion waveform). And the phase variation is corrected by changing the read-out start time of the memory circuit 9 due to making variable the width of the pulse from the hold circuit gating pulse generator 18 shown in FIG. 3.

Figure 3:
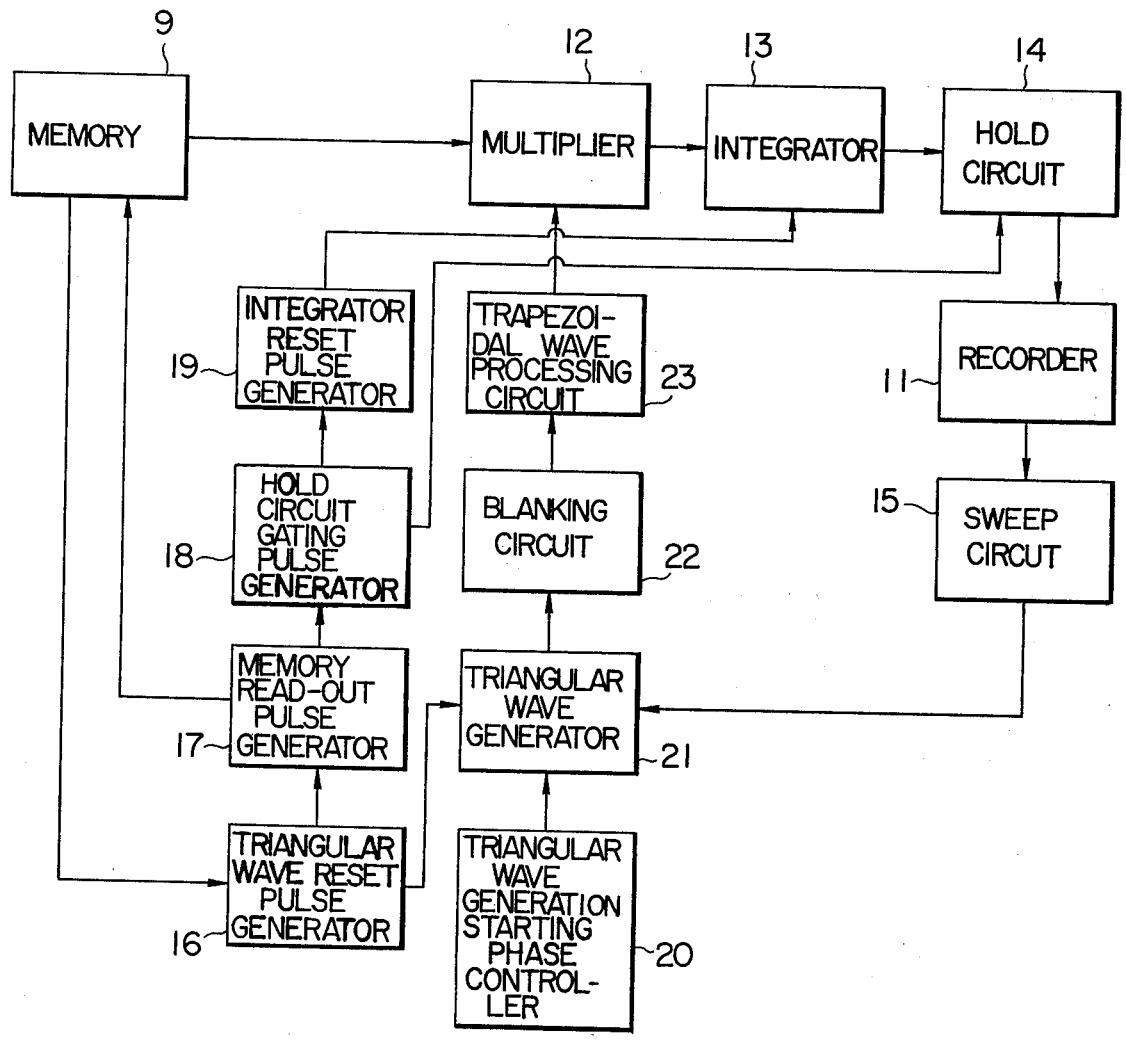
FIG. 3 shows in block diagram a structure of a Fourier transform device used in the nuclear resonance apparatus according to the present invention.
Figure 5:
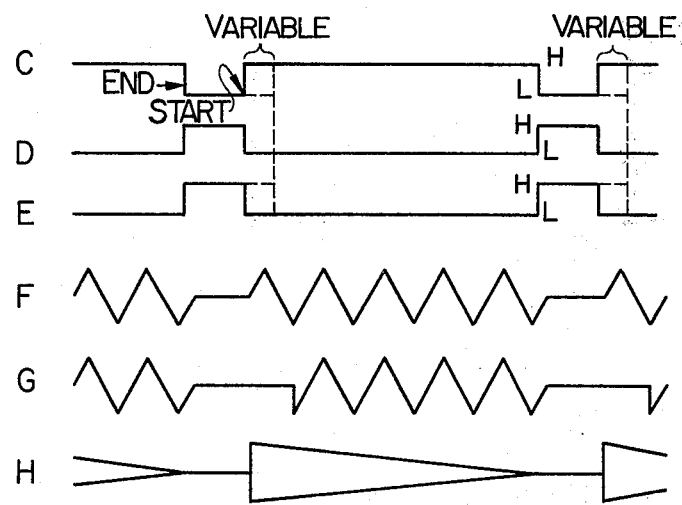
FIG. 5 illustrates waveforms useful to explain the operation of the Fourier transform device shown in FIG. 3.

Next, some of the features of the present invention will be described with reference to the waveforms shown in FIG. 5. The waveform C is the signal synchronized with the times at which the memory circuit starts and ends reading operation and the signal is sent from the memory circuit 9 to the triangular wave reset pulse generator 16, as shown in FIG. 3. The level H of this signal indicates that the memory circuit is in its reading operation while the level L corresponds to the case where the reading operation of the memory circuit is being stopped. The waveform D corresponds to the level of the output of the triangular wave reset pulse generator 16 shown in FIG. 3. The low and high levels L and H of the waveform D are respectivey in synchronism with the high and low levels H and L of the signal C and the triangular wave generator 21 operates when the signal D is at its low level L while it stops when the signal D is at its high level H, as seen from the waveform F in FIG. 5. The waveform E is the output signal of the memory read-out pulse generator 17 shown in FIG. 3 and it is synchronized with the change in the level of the signal D. Moreover, the duration of the level H of the signal E can be arbitrarily set as shown by dotted lines FIG. 5. This means that the periods of the read-out and the rest of the memory circuit 9 can be arbitrarily controlled. The waveform G is the output of the blanking circuit 22 in FIG. 3 at operation and the signal G serves to block the initial portion of the output of the triangular wave generator 21 for the reason described before. The waveform H is the interferogram as the output of the memory circuit 9.

As described above, according to the present invention, there is no need for an expensive electronic computer which is used in the conventional system as a Fourier transform device and a new Fourier transform device can be constructed with inexpensive switching elements and analog IC's. Moreover, the cost of the Fourier transform device according to the present invention is one tenth or less of that of the Fourier transform device in the prior art and the nuclear magnetic resonance apparatus according to the present invention can be fabricated at a cost equal to one third or less of the cost of the conventional nuclear resonance apparatus using an electronic computer as a Fourier transform device. Further, the efficiency of the present apparatus is equal to or even higher than that of the conventional one.

A device which performs Fourier transform without an electronic computer is already known to those skilled in the art but the known device is fundamentally different in structure from the device according to the present invention. The main differences and the features will be described in the following.

1. The known device uses a continuous sinusoidal wave as a periodic function while the present device utilizes as such a function a triangular wave which is repeatedly interrupted and recovered in timing with the read-out operation of the memory circuit. As described above, the present device can employ such a sinusoidal wave. Since the frequency of the periodic function is usually swept, it is necessary to adjust the phases of the periodic function and the interferogram. With the conventional device, the phases are adjusted by synchronizing the phase of the used periodic function with the start of reading operation of the memory circuit by virtue of the beat signal derived from the local oscillator output and the periodic function while in case of the present device such phases can be easily adjusted by controlling the start of generation of the periodic function and by controlling the read-out timing of the memory circuit with respect to the periodic function. Accordingly, the constitutions of the triangular wave generator and the associated peripheral circuits concerning phase processing are much simpler in the present device than in the conventional one.

2. The triangular wave used in the present invention as periodic function contains higher harmonics so that pseudo-peaks appear in the resultant spectrum. In order to eliminate such pseudo-peaks, therefore, the present invention does not use filters affected easily by the variation in frequency but transforms the triangular wave into a trapesoidal wave through waveform shaping. This is one of the outstanding features of the present invention. Through this waveform shaping, as described before, the third harmonic is eliminated and moreover the transformation of the triangular wave into a trapesoidal one can easily be effected by a simple limiter using diodes.

3. According to the present invention, a very exact spectrum can be obtained by the use of a time-variable phase fixing circuit, i.e. blanking circuit as described above, which can prevent Fourier transform from being applied to the initial portion of the interferogram containing the transient disturbance due to the transient phenomenon of the h-f impulse signal.

As apparent from the foregoing description, the present invention has such features and efficiencies associated therewith as cannot be enjoyed by the conventional apparatus.

Now, a concrete embodiment of the present embodiment will be described with reference to FIG. 6, in which the same reference numerals are applied to the equivalent parts as in FIG. 3.

Figure 6:
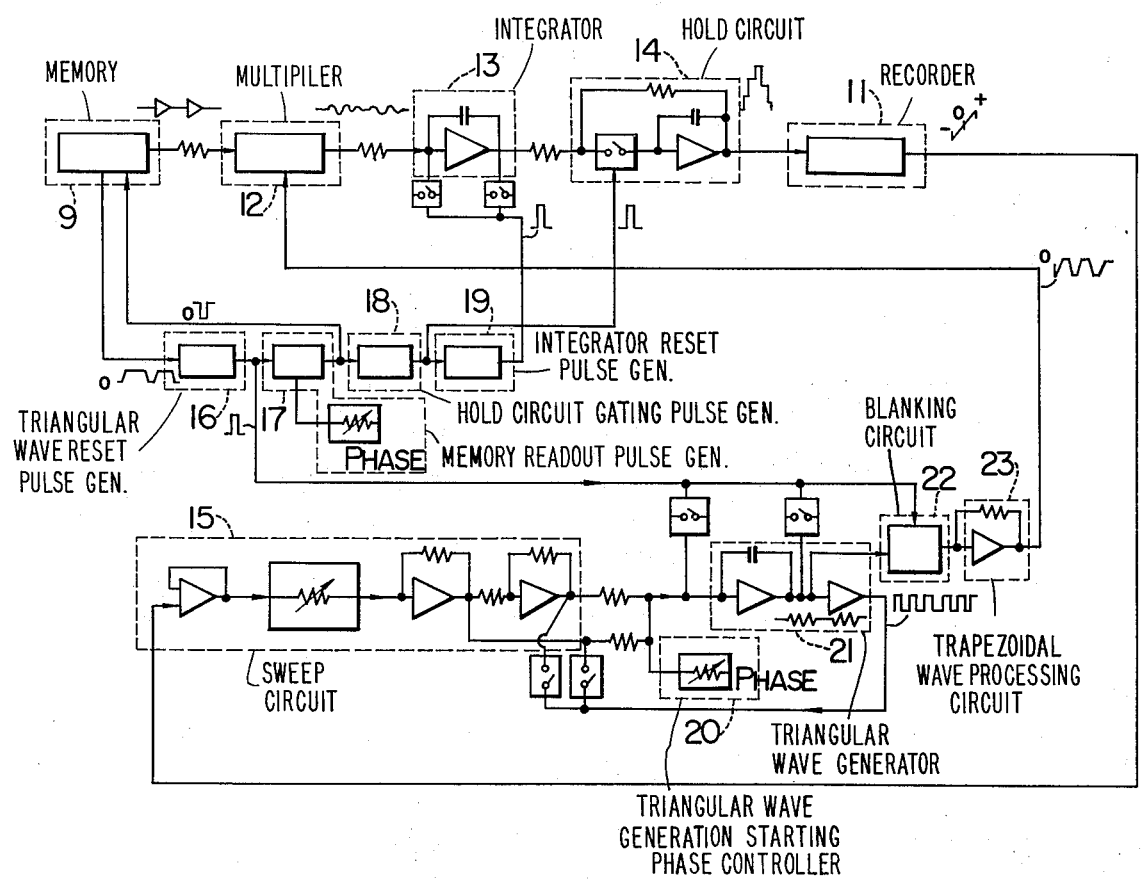
FIG. 6 shows a circuit as a concrete example of the Fourier transform device shown in FIG. 3.

Since the Fourier transform process according to this circuit in FIG. 6 is quite the same as that according to the circuit shown in block diagram in FIG. 3, the description of the process is omitted, but it should here be noted that although the Fourier transform section shown in FIG. 6 consists of simple switching circuits comprising transistors and of oscillating circuits comprising analog IC's, the Fourier transform device can enjoy an efficiency equal to or even higher than that of the conventional device.

As described above, by the use of the periodic function synchronized with the read-out period of the memory circuit the phases appearing in the resulted spectrum can be easily adjusted with a simple circuit device; the higher harmonics can be automatically eliminated through the shaping of the reference signal; and a spectrum with higher accuracy can be obtained by the provision of a blanking circuit which prevents the influence of the transient disturbance of the h-f impulse signal from appearing in the spectrum.

Consequently, according to the present invention, there is no need for such an expensive electronic computer as used for Fourier transform in the conventional nuclear magnetic resonance apparatus, but instead an inexpensive and economical Fourier transform device can be realized. Thus, it goes without saying that the practical merit of the present invention will be very great.

We claim:

1. A nuclear magnetic resonance apparatus of Fourier transform type, comprising memory means to store a nuclear resonance signal induced from a sample disposed in an intense unidirectional magnetic field and further exposed to an h-f impulse magnetic field; read-out means to repeatedly read out the stored resonance signal; Fourier transform means to subject the repeatedly read-out resonance signal to Fourier transform using a periodic function; and synchronizing means to synchronize the period of the repeated read-out of the stored resonance signal with that of the oscillation and stopping of the periodic function.

2. A nuclear magnetic resonance apparatus of Fourier transform type, as claimed in claim 1, further comprising triangular wave generating means to generate a triangular wave used as the periodic function.

3. A nuclear magnetic resonance apparatus of Fourier transform type, as claimed in claim 2, further comprising waveform transforming means to transform into a trapezoidal wave the triangular wave output of the triangular wave generating means.

4. A nuclear magnetic resonance apparatus of Fourier transform type, as claimed in claim 1, wherein the Fourier transform means is provided with multiplying means to make a product of the repeatedly read-out resonance signal and the periodic function, integrating means to integrate the output of the multiplying means, and holding means to hold the output of the integrating means in synchronism with the period of the repeated read-out.

5. A nuclear magnetic resonance apparatus of Fourier transform type, as claimed in claim 4, further comprising triangular wave generation starting phase controlling means to control the phase at the start of generation of the triangular wave generated by the triangular wave generating means.

6. A nuclear magnetic resonance apparatus of Fourier transform type, as claimed in claim 4, further comprising integrator resetting pulse generating means to reset the integrating means.

7. A nuclear magnetic resonance apparatus of Fourier transform type, as claimed in claim 4, further comprising hold circuit gating pulse generating means to cause the holding means to successively hold the output of the integrating means.

8. A nuclear magnetic resonance apparatus of Fourier transform type, as claimed in claim 4, further comprising blanking means to interrupt the periodic function input to the multiplying means only during the time corresponding to the initial portion of the multiplying operation of the multiplying means to make the product of the periodic function and the resonance signal repeatedly read out of the memory means.

* * * * *